LIGHT EMITTING SEMICONDUCTOR DEVICE WITH LIGHT EMISSION FROM SELECTED PORTION(S) OF P-N JUNCTION

Filed Sept. 21, 1966 2 Sheets-Sheet 1

INVENTORS
LEWIS A. DAVIDSON
JOHN P. WASULA

BY George O. Saile
ATTORNEY

United States Patent Office 3,508,111
Patented Apr. 21, 1970

3,508,111

LIGHT EMITTING SEMICONDUCTOR DEVICE WITH LIGHT EMISSION FROM SELECTED PORTION(S) OF P-N JUNCTION

Lewis A. Davidson, Wappingers Falls, and John P. Wasula, Troy, N.Y., assignors to International Business Machines Corporation, Armonk, N.Y., a corporation of New York Filed Sept. 21, 1966, Ser. No. 581,074
Int. Cl. H05b 33/00, 41/44
U.S. Cl. 315—169 14 Claims

ABSTRACT OF THE DISCLOSURE

A P-N junction light source having such a spatial control of the emitted light is composed of a semiconductor material having at least one P-N light emitting junction. Means are provided to allow a localized bias across at least certain portions of the P-N junction to cause light emission at the desired portion of the P-N junction. An isolating substrate junction may be used to form a lower portion of the light source and is below the P-N junction. Means are provided for adjusting the lateral current between the substrate junction and the P-N junction to control the light emission area along the P-N junction.

This invention relates to a semiconductor device which contains means for adusting debiasing along a P-N junction. More particularly, the device is capable of controlling the spatial location of light emission from junctions of opposite conductivity material, conventionally known as P or N type.

When an electron in a semiconductor undergoes a transition to a lower energy state, the energy it loses may be emitted as a photon. The wavelength of the emitted photon is related to the energy lost by the electron. Conventionally, the term light refers to those photons which are in a wavelength range detectable by the human eye. In this invention, however, the more general concept of light emission is meant and refers to all the photon emission from a semiconductor. Thus light is not restricted to those photons whose wavelength is in the range of sensitivity of the eye.

Since the wavelength of the light is determined by its energy transition, it can be controlled to a degree by controlling the type of light emission mechanism. For example, the most efficient known form of light emission is radiative recombination of holes and electrons in a direct band-gap semiconductor when it is forward-biased. The wavelength of this narrow band emission is uniquely related to the band-gap energy of the semiconductor from which it is emitted. Thus, it can be controlled by changing the band-gap energy. Variation of semiconductor material and/or composition, external magnetic fields, ambient temperature, and mechanical stress have been used to vary the band-gap and hence control the wavelength of the light emission.

Another significant light emission mechanism is light emission during electrical breakdown of P-N junctions. Although the exact nature of this mechanism is not fully understood, it is known to occur for either tunnelling or avalanche multiplying junctions and results in emission over a broad band of wavelengths, thus appearing as white light. These and other forms of light emission such as donor-acceptor pair recombination, tunnelling and indirect radiative recombination, which require a properly biased P-N junction result in wavelength or frequency control of semiconductor light emission.

No technique for controlling the spatial location of the emitted light is generally known except for positioning of entire P-N junctions at which, or in the vicinity of which, depending on the mechanism, the light emission occurs. This last technique is disadvantageous in many applications for it may require excessive metallization for contacts and/or masking of unwanted light and constraints on the density of light emitters, does not allow controlled emission over large areas or electronic selection of light emitting areas, and does not give single well-defined lines of light Control of the spatial location of P-N junction light emission is desirable or necessary for many applications. Lines may be used to record data on film or for instantaneous detection of various conditions. An electro-optic signal path may be controlled and thus direction of transmission may be inhibited or controlled. With external optics, larger patterns may be used for numerical display or to form various fixed alphanumeric characters or patterns for either permanent storage or printing or for instantaneous viewing.

It is thus an object of the invention to provide a semiconductor device which contains means for adjusting debiasing along a P-N junction.

It is a further object of this invention to provide a P-N junction light source wherein the spatial location of P-N junction light emission is controlled for the various light emission mechanisms.

It is a still further object of this invention to utilize this technique to overcome the above mentioned problems in any discrete or array usage of P-N junction light emitters, including application wherein the light emission is used directly or in a modified form.

Transverse current denotes in this invention those current components in some arbitrary region which eventually cross a P-N junction in that region. Lateral current denotes the remaining current components which do not cross any junction in that region. The basic concept of this invention is to control the lateral current flow in a semiconductor and thus control the spatial location of the light emission or any other phenomena which is affected by lateral current flow such as protection against secondary breakdown. To obtain this result, it is recognized that all of the known P-N junction light emission mechanisms in a semiconductor require charge carriers, either holes or electrons, in a non-equilibrium state. These carriers emit photons in their attempts to reach equilibrium. This is independent of whether the actual mechanisms yield emission in the bulk materials near the P-N junction, typically from radiative recombinations, or in the transition region between materials of different conductivity types, typically from electrical breakdown. The motion of these charged carriers constitutes current and hence spatial control of the current yields control of the location of the light emission.

A P-N junction light source having such a spatial control of the emitted light is therefore formed which is composed of a semiconductor material having at least one P-N light emitting junction. Means are provided to allow a localized bias across at least certain portions of the P-N junction to cause light emission in the P-N junction. An isolating substrate junction forms the lower portion of the light source and is below the P-N junction. Means are then provided for adjusting the lateral current between the substrate junction and the P-N junction to control the light emission area along the P-N junction.

The foregoing and other objects, features and advantages of the invention will be apparent from the following more particular description of the preferred embodiments of the invention as illustrated in the accompanying drawings.

Figure 1:
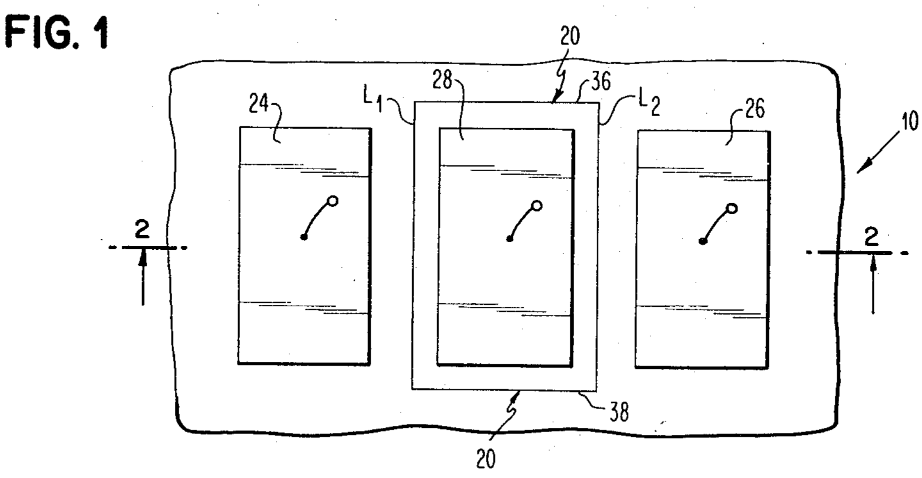
FIGURE 1 shows one form of a P-N junction light source of the present invention.
Figure 2:
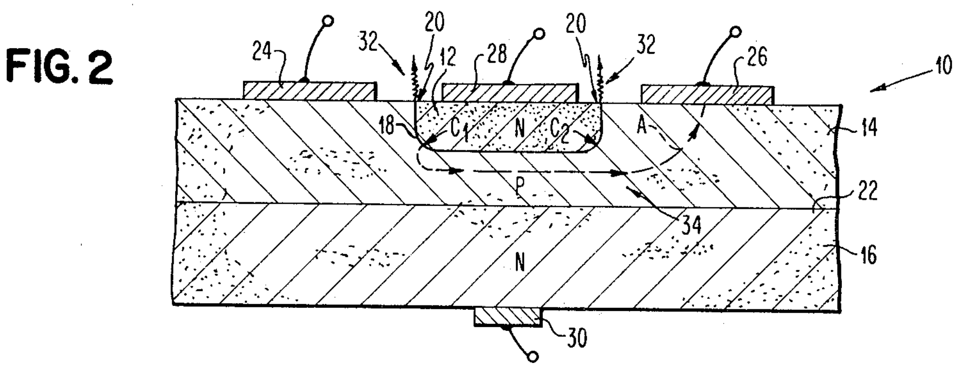
FIGURE 2 is a cross-sectional view of the FIGURE 1 device.

The invention may be qualitatively understood by recognizing that motion of charge carriers establishes an electrical field which opposes such motion. Thus, lateral current flow beside a P–N junction sets up an electric field which debiases the junction. Referring now more particularly to FIGURES 1 and 2, the planar monocrystalline semiconductor light source device 10 includes an N region 12, a P region 14, and an N region 16. The P-N light emitting junction 18 ends at the surface of the light source device 10 at 20. The isolating substrate junction 22 is located below the P-N junction. Terminals 24 and 26, located on either side of the P-N junction 18, are individual electrical contacts to the region 14 of the device. The terminal 28 is the electrical connection to region 12 and terminal 30 is the electrical connection to region 16.

The current leaving the vicinity of the electrical contact debiases the P-N junction and the active junction area, in which there is current flow, is much smaller than the actual physical junction area. This effect is complicated considerably because the lateral current is reduced by the transverse current at any point. A non-linear differential equation is required to characterize this phenomena. The exact form of this equation will depend on the nature of the light emitting mechanism and the relevant junction law describing the transverse current as a function of the potential across the P-N junction.

The control of the light emission 32 is accomplished by controlling the location of the current flow. The current flow is determined by the potential at any point. The potential in turn may be controlled by the material composition, that is the doping level and semiconductor material used, and device structure.

The operation of the FIGURE 1, 2 device may be understood by considering the case of both contacts 24 and 26 electrically grounded with a positive bias applied to the region 12. Breakdown occurs at $C_1$ and $C_2$ with accompanying light emission at 32. The current flows to the nearest contact 24 or 26. If the junction is sufficiently deep, the self-absorption of the silicon will result in only a line of visible light where the junction ends at the surface of device 10.

Now consider the case of 24 electrically open. For $C_1$ to continue to suffer breakdown when the proper bias is applied to 26, current would have to flow along path A. The potential associated with the current flow would add algebraically to the applied bias and is largest where the width of the region 34 between the P-N junction and the isolating junction is small and the doping level relatively low. The net voltage at $C_1$ would be less than the breakdown voltage and hence breakdown cannot occur at $C_1$. Likewise, with 26 open and 24 biased to breakdown, the breakdown occurs at $C_1$ and not at $C_2$. This biasing results in the vertical lines of light at $L_1$ and $L_2$, respectively, in FIGURE 1. The portions of the 36 and 38 of the P-N junction reaching the surface 20 of the light source 10 do not emit light in these cases.

The same general behaviour occurs independent of the light emitting mechanism. For example, forward bias emission requires only a change in the direction of current flow and bias polarity. In general, if conditions are designed to give sufficient lateral debiasing these effects occur and the various types of mechanisms only change the details of the solution not the general result.

Significant lateral debiasing does not generally occur in conventional structures. The device of the present invention requires a physical spacing between the P-N junction 18 and the isolating substrate junction 22 of between about 20 to 200 microinches. The electrical width which is defined as the distance between functional depletion layers is substantially less than the physical width. The necessary doping level of the region is between about $10^{15}$ to $10^{17}$ atoms per cubic centimeters and must be traded-off with respect to the base width. The adjustment of these two characteristics of region 34 is critical and establishes the resistance of this region to lateral current flow. These characteristics are substantially independent of semiconductor material. A plurality of independent electrical terminals or contacts to a given region is also necessary.

The use of an active isolating substrate junction together with a terminal 30 and appropriate reverse bias source (not shown) provides means for further adjusting the lateral current in the region 34. The application of the bias extends the depletion layer further into the region 34 giving a smaller region width and increases the resistance to lateral current flow in the region.

Figure 3:
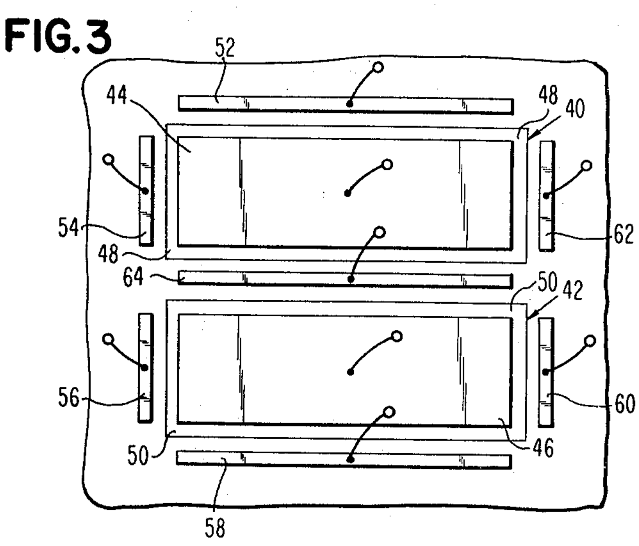
FIGURE 3 illustrates a numeric display device which utilizes the principle of the present invention.

FIGURE 3 shows an extension of the FIGURES 1, 2 concept which is particularly useful as a numeric display device. A pair of P-N junctions 40, 42 of the FIGURES 1, 2 concept extend to the surface of the display device. Terminals 44 and 46 provide electrical contacts to the inner regions 48 and 50, respectively. Terminals 52, 54, 56, 58, 60, 62 and 64 are positioned closely adjacent to the P-N junctions and individually electrically connect the outer regions. The controlled application of bias to these terminals using the principles given above in conjunction with FIGURE 1 and 2 embodiment allows the production of numbers one through nine to be displayed.

Figures 4, 6:
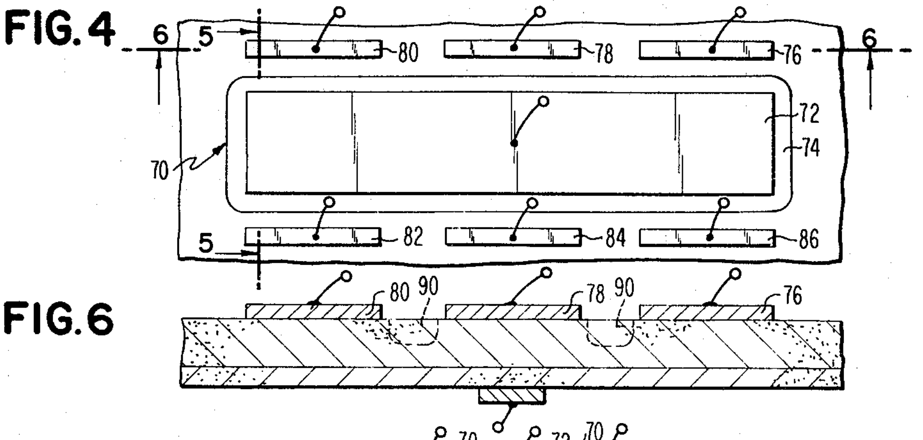
FIGURE 4 illustrates a discrete line array made according to the principles of the present invention.
FIGURE 6 is a cross-section taken along line 6—6 of FIGURE 4.
Figure 5:
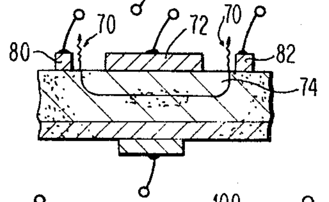
FIGURE 5 is a cross-section along line 5—5 of FIGURE 4.

FIGURES 4, 5 and 6 show a further extension of the FIGURES 1 and 2 embodiment wherein discrete lines of light may be controllably emitted along the P-N junction 70 which extends to the surface of the device. A terminal 72 electrically contacts the inner region 74. Terminals 76, 78, 80, 82, 84 and 86 electrically contact the outer region. More or fewer terminals can be used to contact the outer region depending upon the number of light lines desired. Discrete lines of light can be controllably produced using the principles described above in conjunction with the FIGURES 1 and 2 embodiment. Lateral debiasing results in discrete sections of the uniform P-N junction emitting light. Regions 90 may be provided which have compensating diffusions for lower conductivity or be etched out. Each of these techniques enhances lateral debiasing.

Figure 7:
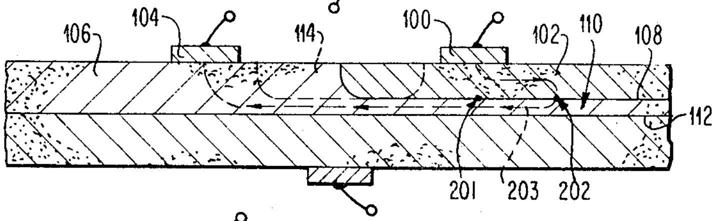
FIGURE 7 illustrates another light emission structure, made according to the principles of the present invention utilizing broad area emission.
Figure 9:
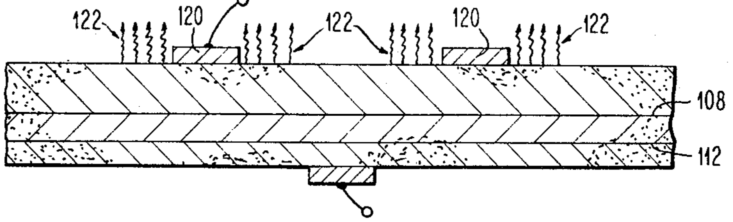
FIGURE 9 illustrates a cross-section of the FIGURE 8 device taken along line 9—9.
Figure 8:
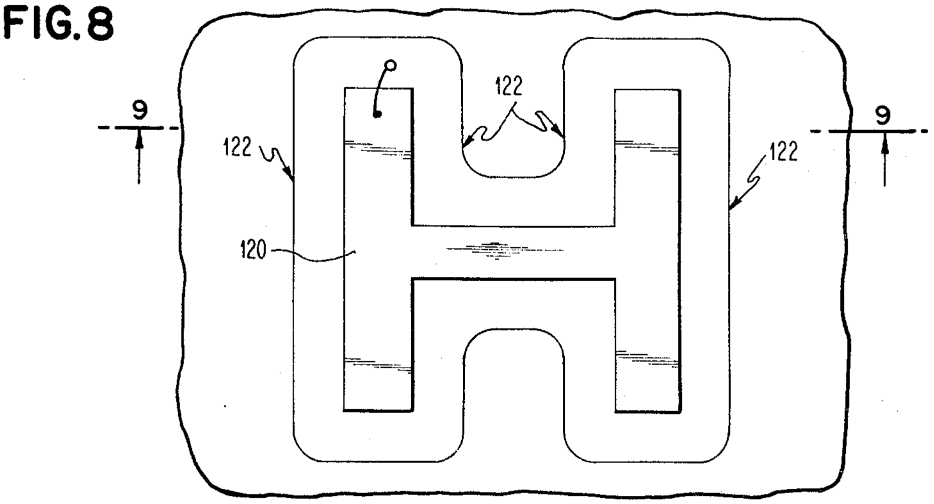
FIGURE 8 illustrates another broad area light emission structure made according to the present invention.

The above embodiments involve light emission at the P–N junction line only. However, broad area light emission extending away from the P–N junction line can also be obtained. Double junction control of broad area emission is indicated in FIG. 7. The terminal 100 is the electrical contact to region 102 and the terminal 104 contacts region 106. The light emitting P–N junction 108 is sufficiently close to the surface of the device for the broad area emission of the light to be controlled by the terminal 100. The terminal contact area 100 can be very small in relation to the light emitted depending upon the debiasing, along the P–N junction 108 and the control of the lateral current flow by the character of the region 110 between the P–N junction 108 and the isolating substrate junction 112. The isolating substrate junction 112 causes a constraint of current in region 110 thus enhancing the lateral debiasing of the light emitting P–N junction 108. As a modification, the intense light from region 114 may be eliminated, if desired, either by masking the region 114 or by removing it by etching. The broad area emission is controlled by contact placement. As an example, the letter H is illustrated in FIGURES 8 and 9 where the terminal is 120 and the extent of the light emitted is 122. FIGURES 8 and 9 are meant to show the terminal geometry for the terminals corresponding to the terminals 100 in the FIGURE 7 device. Thus, the terminals corresponding to terminals 104 of the FIGURE 7 device are not shown and it is understood that any of the techniques disclosed by the FIGURE 7 may be used to limit the spatial extent of the light emission. The FIGURE 7 device can be operated using a single junction. However, it is then necessary to have tighter control of the physical characteristics of region 102.

The control of the current flowing along the P–N junction controls those physical phenomena depended upon the current flowing across the P–N junction. The transverse current does not affect the bias along a junction. The lateral current, all current components flowing along or parallel to a P–N junction, affects the bias along the junction. In the simplest case, that is just described by Ohm's law, relating to potential differences to the current flow. Debiasing refers to the alteration of the potential difference or bias across a P–N junction at different spatial locations. As an example, in FIGURE 7 the transverse current at location 202 is less than the transverse current at location 201. This is because the lateral current shown schematically by flow line 203 establishes a potential drop in the region between the P–N junctions 108 and 112 and locations 201 and 202. Thus, at location 202 there is a smaller potential difference across the P–N junction 108 than there is at location 201, that is location 202 is debiased with respect to location 201 by the lateral current.

The following example is included in order to aid in the understanding of the invention and variations may be made by one skilled in the art without departing from the spirit of the invention.

Example

The substrate wafer used was composed of about 0.012 ohm-centimeters antimony-doped silicon having a phosphorus-doped ($8 \times 10^{14}$ atoms per cubic centimeter) epitaxial layer about 7.3 microns in thickness. The wafer was loaded into a slotted quartz boat and placed in a diffusion furnace at 970° C., where it was oxidized for fifteen minutes in dry oxygen and for 105 minutes in steam. A KPR photoresist was applied to the wafer, where it was dried, exposed, developed and fixed to provide the suitable pattern for etching the silicon dioxide to obtain the desired region 14 diffusion pattern. The silicon dioxide was then etched using buffered hydrofluoric acid. The photoresist was removed and the wafer cleaned and dried. The wafer was sealed in an evacuated quartz capsule along with a powdered silicon source containing boron of a suitable quantity. After the capsule was sealed, it was placed in a diffusion furnace for 35 minutes at 1100° C. The wafer was then removed from the furnace and a silicon dioxide coating of approximately 3500 angstrom units was grown over the wafer by conventional steam oxidation techniques as described above.

A KPR photoresist was applied to the wafer, dried, exposed, developed and fixed to provide the suitable pattern for etching the silicon dioxide to obtain the desired region 12 diffusion pattern. The silicon dioxide film in the region 12 was etched using buffered hydrofluoric acid. The photoresist was then removed and the wafer cleaned and dried. The wafer was loaded into a slotted quartz boat and placed in a diffusion furnace at 925° C. The input gases to the system consisted of oxygen, phosphine and nitrogen. The deposition time was about 6 minutes. The wafer was then removed from the furnace and once again loaded into a slotted quartz boat and placed in a suitable oxidation furnace where the opening to region 12 was reoxidized using conventional steam techniques. Suitable contacts were made to the active regions 12, 14 and 16 of the device. The resulting device was that shown in the FIGURES 1 and 2 embodiment. The physical width of the region 34 was 60 microinches and the electrical width was 34 microinches. The doping level of the region was about $10^{15}$ to $10^{16}$ atoms per cubic centimeter.

Light emission was detected in the device when both terminals 24, 26 were electrically connected and the P-N junction was reverse biased to breakdown. Discrete areas of light emission were also obtained with alternately one then the other terminals 24, 26 electrically open. Light lines were not emitted along the P-N junction at 36, 38.

While the invention has been particularly shown and described with reference to the preferred embodiments thereof, it will be understoood by those skilled in the art that various changes in form and detail may be made therein without departing from the spirit and scope of the invention.

What is claimed is:

1. A semiconductor device comprising:
at least one P-N junction;
means for providing a localized bias across at least certain portions of said P-N junction;
an isolating substrate junction below said P-N junction; and
means for adjusting the lateral current flowing between the said isolating junction and the said P-N junction to control debiasing along said P-N junction and, thus, in turn control the spatial distribution of the transverse current flowing across the said P-N junction and any physical phenomena directly dependent upon the current flowing across the said P-N junction.

2. The device of claim 1 wherein said isolating junction is an active junction and said means for adjusting includes means for reverse biasing said active isolating junction to adjust the resistance to said lateral current.

3. The device of claim 2 wherein the region between said isolating junction and said P-N junction is between about 20 to 200 microinches.

4. A P-N junction light source having a spatial control of the emitted light comprising:
a planar, monocrystalline semiconductor device having at least one P-N light emitting junction wherein said junction ends at the surface of said light source;
a terminal located on either side of said junction on said surface for providing a localized bias across at least certain portions of said P-N junction to cause light emission in the said P-N junction;
an active isolating substrate junction below said P-N junction; and
means for adjusting the current between the said isolating junction and the said P-N junction to control the light emission area along said P-N junction.

5. The light source of claim 4 wherein said means for adjusting includes said isolating junction, and means for reverse biasing said isolating junction to adjust the resistance to said current.

6. The light source of claim 4 wherein the region between said isolating junction and said P-N junction is between about 20 to 200 microinches in width and the doping level is between about $10^{15}$ to $10^{17}$ atoms per cubic centimeter.

7. The light source of claim 4 wherein said semiconductor device is composed of at least in part silicon.

8. The light source of claim 4 wherein said semiconductor device is composed of at least in part gallium arsenide.

9. The light source of claim 4 wherein said semiconductor device is composed of at least in part gallium phosphide.

10. A semiconductor device comprising:
at least one PN light-emitting junction;
plural electrical contacts provided on said semiconductor device and adjacent to said P-N junction; and
bias means associated with said contacts operable to reverse bias said P-N junction and to selectively control current injection over at least one portion of said P-N junction by localize bias across certain said portion to cause light emission only at the desired said portion.

11. The device of claim 10 wherein said bias means includes further selective specific optical light pattern generation means.

12. The device of claim 10 further comprising an isolating substrate junction below said at least one P-N junction; and means for adjusting the current between the said isolating junction and the said P-N junction to control debiasing along said P-N junction.

13. The device of claim 12 wherein said isolating junction is an active junction and said means for adjusting includes means for reverse biasing said active isolating junction to adjust the resistance to said current.

14. A semiconductor device comprising:

at least one P-N junction;

means for providing a localized bias across at least certain portions of said P-N junction;

an active isolating substrate junction below said P-N junction; and means for adjusting the current flowing between the said isolating junction and the said P-N junction to control debiasing along said P-N junction, said means for adjusting includes means for reverse biasing said active substrate junction to adjust the resistance to said current.

References Cited

UNITED STATES PATENTS

| | | | |
|---|---|---|---|
| 3,341,857 | 9/1967 | Kabell | 313—108 X |
| 3,366,802 | 1/1968 | Hilbiber | 307—311 X |
| 3,257,626 | 6/1966 | Marinace et al. | 331—94.5 |
| 3,402,366 | 9/1968 | Williams et al. | 331—94.5 |
| 3,427,563 | 2/1969 | Lasher | 331—94.5 |
| 3,436,679 | 4/1969 | Fenner | 331—94.5 |

JAMES W. LAWRENCE, Primary Examiner

P. C. DEMEO, Assistant Examiner

U.S. Cl. X.R.

313—108; 317—235